United States Patent
Xu et al.

(10) Patent No.: US 8,262,894 B2
(45) Date of Patent: Sep. 11, 2012

(54) HIGH SPEED COPPER PLATING BATH

(75) Inventors: Xingling Xu, Moses Lake, WA (US); Eric Webb, Moses Lake, WA (US)

(73) Assignee: Moses Lake Industries, Inc., Moses Lake, WA (US)

( * ) Notice: Subject to any disclaimer, the term of this patent is extended or adjusted under 35 U.S.C. 154(b) by 512 days.

(21) Appl. No.: 12/433,657

(22) Filed: Apr. 30, 2009

(65) Prior Publication Data
US 2010/0276292 A1 Nov. 4, 2010

(51) Int. Cl.
C25D 3/38 (2006.01)
C25D 21/18 (2006.01)
C25D 5/02 (2006.01)

(52) U.S. Cl. ........ 205/291; 205/101; 205/118; 205/123; 205/126; 205/296

(58) Field of Classification Search .................. 205/101, 205/296, 118, 123, 126, 291
See application file for complete search history.

(56) References Cited

U.S. PATENT DOCUMENTS

| | | | |
|---|---|---|---|
| 2,374,289 A * | 4/1945 | Hull | 205/293 |
| 2,689,808 A | 9/1954 | Crayton | |
| 2,695,310 A | 11/1954 | Schramm at al. | |
| 2,837,781 A | 6/1958 | Teggler | |
| 3,132,043 A | 5/1964 | Clayton | |
| 3,383,293 A | 5/1968 | Matthews et al. | |
| 3,424,698 A * | 1/1969 | Hertz et al. | 252/500 |
| 3,460,977 A | 8/1969 | Golben | |
| 3,615,272 A | 10/1971 | Collins et al. | |
| 3,832,291 A | 8/1974 | Arcilesi | |
| 3,855,085 A | 12/1974 | Rushmere | |
| 3,932,659 A | 1/1976 | Green et al. | |
| 3,998,707 A | 12/1976 | Fong | |
| 4,045,305 A | 8/1977 | Fong et al. | |
| 4,049,505 A | 9/1977 | Chatterji | |
| 4,049,510 A | 9/1977 | Rosenberg | |
| 4,070,256 A | 1/1978 | Hsu et al. | |
| 4,072,582 A | 2/1978 | Rosenberg | |
| 4,075,066 A | 2/1978 | Eckles et al. | |
| 4,134,803 A | 1/1979 | Eckles et al. | |
| 4,139,425 A | 2/1979 | Eckles et al. | |

(Continued)

FOREIGN PATENT DOCUMENTS

DE 2610705 A1 9/1977

(Continued)

OTHER PUBLICATIONS

Arthur Keigler, Bill Wu & Zhen L1U, "Copper Deposition For Pillars and Vias", Semiconductor Manufacturing, Aug. 2006, vol. 7 Issue 8.

(Continued)

*Primary Examiner* — Edna Wong
(74) *Attorney, Agent, or Firm* — Nutter McClennen & Fish LLP; Reza Mollaaghababa; Andrew W. Schultz

(57) ABSTRACT

A copper electroplating bath that includes an aqueous solution that comprises a copper salt and at least one acid and a container that comprises a copper salt in solid form, is disclosed. The container supplies copper ions to the aqueous solution to maintain the copper ion concentration of the aqueous solution at saturation levels while retaining the copper salt in solid form within the container.

25 Claims, 3 Drawing Sheets

U.S. PATENT DOCUMENTS

| | | |
|---|---|---|
| 4,146,441 A | 3/1979 | Willis |
| 4,146,442 A | 3/1979 | McFarland |
| 4,162,947 A | 7/1979 | Canaris |
| 4,218,292 A | 8/1980 | Fellman et al. |
| 4,285,802 A | 8/1981 | Rynne |
| 4,324,623 A | 4/1982 | Schaer |
| 4,336,114 A | 6/1982 | Mayer et al. |
| 4,347,108 A | 8/1982 | Willis |
| 4,374,709 A | 2/1983 | Combs |
| 4,376,685 A | 3/1983 | Watson |
| 4,378,281 A * | 3/1983 | Scanlon et al. ............... 204/198 |
| 4,384,930 A | 5/1983 | Eckles |
| 4,388,160 A | 6/1983 | Rynne |
| 4,399,266 A | 8/1983 | Matsumura et al. |
| 4,417,957 A | 11/1983 | Rosenberg |
| 4,512,856 A | 4/1985 | Paneccasio |
| 4,530,741 A | 7/1985 | Rosenberg |
| 4,545,870 A | 10/1985 | Rosenberg |
| 4,582,576 A | 4/1986 | Opaskar et al. |
| 4,642,414 A | 2/1987 | Rasch et al. |
| 4,662,999 A | 5/1987 | Opaskar et al. |
| 4,665,277 A | 5/1987 | Sah et al. |
| 4,778,572 A * | 10/1988 | Brown ............................ 205/96 |
| 4,880,132 A | 11/1989 | Coch et al. |
| 4,885,064 A | 12/1989 | Bokisa et al. |
| 4,898,652 A | 2/1990 | Bammel et al. |
| 4,927,770 A | 5/1990 | Swanson |
| 4,999,397 A | 3/1991 | Weiss et al. |
| 5,051,154 A | 9/1991 | Bernards et al. |
| 5,174,887 A | 12/1992 | Federman et al. |
| 5,232,575 A | 8/1993 | Dodd |
| 5,252,196 A | 10/1993 | Sonnenberg et al. |
| 5,282,954 A | 2/1994 | Opaskar |
| 5,328,589 A | 7/1994 | Martin |
| 5,415,762 A | 5/1995 | Allardyce et al. |
| 5,433,840 A | 7/1995 | Dahms et al. |
| 5,443,727 A * | 8/1995 | Gagnon ........................ 210/490 |
| 5,528,000 A | 6/1996 | Allardyce et al. |
| 5,534,649 A | 7/1996 | Cho et al. |
| 5,575,898 A | 11/1996 | Wolf et al. |
| 5,627,081 A | 5/1997 | Tsuo et al. |
| 5,656,148 A | 8/1997 | Martyak et al. |
| 5,698,087 A | 12/1997 | Bokisa |
| 5,833,820 A | 11/1998 | Dubin |
| 5,882,498 A | 3/1999 | Dubin et al. |
| 5,907,766 A | 5/1999 | Swanson et al. |
| 5,965,679 A | 10/1999 | Godschalx et al. |
| 5,972,192 A | 10/1999 | Dubin et al. |
| 6,024,856 A | 2/2000 | Haydu et al. |
| 6,024,857 A | 2/2000 | Reid |
| 6,077,405 A | 6/2000 | Biggs et al. |
| 6,083,838 A | 7/2000 | Burton et al. |
| 6,093,636 A | 7/2000 | Carter et al. |
| 6,107,357 A | 8/2000 | Hawker et al. |
| 6,113,771 A | 9/2000 | Landau et al. |
| 6,129,830 A | 10/2000 | Senge et al. |
| 6,193,789 B1 | 2/2001 | Honma et al. |
| 6,204,202 B1 | 3/2001 | Leung et al. |
| 6,231,989 B1 | 5/2001 | Chung et al. |
| 6,251,234 B1 | 6/2001 | Henington et al. |
| 6,251,710 B1 | 6/2001 | Radens et al. |
| 6,258,241 B1 | 7/2001 | Takahashi |
| 6,277,450 B1 | 8/2001 | Katoot et al. |
| 6,284,121 B1 | 9/2001 | Reid |
| 6,338,411 B1 | 1/2002 | katabe |
| 6,344,129 B1 | 2/2002 | Rodbell et al. |
| 6,344,413 B1 | 2/2002 | Zurcher et al. |
| 6,350,366 B1 | 2/2002 | Landau et al. |
| 6,350,386 B1 | 2/2002 | Lin |
| 6,352,467 B1 | 3/2002 | Somekh et al. |
| 6,358,388 B1 | 3/2002 | Bleck et al. |
| 6,358,832 B1 | 3/2002 | Edelstein et al. |
| 6,362,099 B1 | 3/2002 | Gandikota et al. |
| 6,368,484 B1 | 4/2002 | Volant et al. |
| 6,368,966 B1 | 4/2002 | Krishnamoorthy et al. |
| 6,379,522 B1 | 4/2002 | Landau et al. |
| 6,379,745 B1 | 4/2002 | Kydd et al. |
| 6,380,083 B1 | 4/2002 | Gross |
| 6,395,199 B1 | 5/2002 | Krassowski et al. |
| 6,403,481 B1 | 6/2002 | Matsuda et al. |
| 6,406,794 B1 | 6/2002 | Shiota et al. |
| 6,413,882 B1 | 7/2002 | Leung et al. |
| 6,423,770 B1 | 7/2002 | Katz |
| 6,425,996 B1 | 7/2002 | Dahms et al. |
| 6,432,821 B1 | 8/2002 | Dubin et al. |
| 6,444,110 B2 | 9/2002 | Barstad et al. |
| 6,456,606 B1 | 9/2002 | Terasawa |
| 6,491,806 B1 | 12/2002 | Dubin et al. |
| 6,511,912 B1 | 1/2003 | Chopra et al. |
| 6,518,182 B1 | 2/2003 | Ishikawa et al. |
| 6,531,046 B2 | 3/2003 | Morrissey et al. |
| 6,544,399 B1 | 4/2003 | Landau et al. |
| 6,551,487 B1 | 4/2003 | Reid et al. |
| 6,562,555 B2 | 5/2003 | Fiebag et al. |
| 6,569,302 B1 | 5/2003 | Steinrucke |
| 6,582,578 B1 | 6/2003 | Dordi et al. |
| 6,596,151 B2 | 7/2003 | Landau et al. |
| 6,605,204 B2 | 8/2003 | Martyak et al. |
| 6,607,654 B2 | 8/2003 | Lee et al. |
| 6,610,191 B2 | 8/2003 | Landau et al. |
| 6,610,192 B1 | 8/2003 | Step et al. |
| 6,645,364 B2 | 11/2003 | Calvert et al. |
| 6,649,038 B2 | 11/2003 | Mikkola et al. |
| 6,660,153 B2 | 12/2003 | Merricks et al. |
| 6,676,823 B1 | 1/2004 | Bokisa |
| 6,679,983 B2 | 1/2004 | Morrissey et al. |
| 6,682,642 B2 | 1/2004 | Mikkola et al. |
| 6,685,817 B1 | 2/2004 | Mathieu |
| 6,706,418 B2 | 3/2004 | Egli et al. |
| 6,709,562 B1 | 3/2004 | Andricacos et al. |
| 6,709,564 B1 | 3/2004 | Tench et al. |
| 6,740,221 B2 | 5/2004 | Cheung et al. |
| 6,743,211 B1 | 6/2004 | Prausnitz et al. |
| 6,746,589 B2 | 6/2004 | Mishima et al. |
| 6,773,568 B2 | 8/2004 | Egli et al. |
| 6,774,051 B2 | 8/2004 | Chung et al. |
| 6,776,893 B1 | 8/2004 | Too et al. |
| 6,797,142 B2 | 9/2004 | Crosby |
| 6,797,146 B2 | 9/2004 | Morrissey et al. |
| 6,800,188 B2 | 10/2004 | Hagiwara et al. |
| 6,835,294 B2 | 12/2004 | Tsuchida et al. |
| 6,844,274 B2 | 1/2005 | Yoshioka et al. |
| 6,863,795 B2 | 3/2005 | Teerlinck et al. |
| 6,881,319 B2 | 4/2005 | Seita et al. |
| 6,890,416 B1 | 5/2005 | Mayer et al. |
| 6,893,550 B2 | 5/2005 | Dubin et al. |
| 6,924,224 B2 | 8/2005 | Egitto et al. |
| 6,926,922 B2 | 8/2005 | Leung et al. |
| 6,946,716 B2 | 9/2005 | Andricacos et al. |
| 7,105,082 B2 | 9/2006 | Hardikar |
| 7,128,822 B2 | 10/2006 | Wang et al. |
| 7,135,350 B1 | 11/2006 | Smith et al. |
| 7,144,751 B2 | 12/2006 | Gee et al. |
| 7,179,736 B2 | 2/2007 | Kwak et al. |
| 7,182,849 B2 | 2/2007 | Shih et al. |
| 7,204,865 B2 | 4/2007 | Yamada |
| 7,232,513 B1 | 6/2007 | Webb et al. |
| 7,303,992 B2 | 12/2007 | Paneccasio et al. |
| 7,316,772 B2 | 1/2008 | Commander et al. |
| 7,335,288 B2 | 2/2008 | Hardikar |
| 7,338,689 B2 | 3/2008 | Shin et al. |
| 7,344,986 B2 | 3/2008 | Inoue et al. |
| 7,368,045 B2 | 5/2008 | Vereecken et al. |
| 7,371,311 B2 | 5/2008 | Zierath et al. |
| 7,405,163 B1 | 7/2008 | Drewery et al. |
| 7,413,976 B2 | 8/2008 | Shih et al. |
| 7,429,401 B2 | 9/2008 | Josell et al. |
| 7,439,182 B2 | 10/2008 | Hong |
| 7,442,267 B1 | 10/2008 | Webb et al. |
| 7,446,263 B2 * | 11/2008 | En ................... 174/262 |
| 7,449,098 B1 | 11/2008 | Mayer et al. |
| 7,510,993 B2 | 3/2009 | Levey et al. |
| 7,524,347 B2 | 4/2009 | Sun et al. |
| 7,575,666 B2 | 8/2009 | Watkowski et al. |
| 7,598,168 B2 | 10/2009 | Han et al. |
| 7,781,288 B2 | 8/2010 | Haensch et al. |
| 2001/0015321 A1 | 8/2001 | Reid et al. |

| | | |
|---|---|---|
| 2001/0047943 A1 | 12/2001 | Barstad et al. |
| 2002/0000382 A1 | 1/2002 | Morrissey et al. |
| 2002/0043467 A1 | 4/2002 | Morrissey et al. |
| 2002/0043468 A1 | 4/2002 | Mikkola et al. |
| 2002/0053519 A1 | 5/2002 | Morrissey et al. |
| 2002/0074231 A1 | 6/2002 | Mikkola et al. |
| 2002/0074242 A1 | 6/2002 | Morrissey et al. |
| 2002/0084191 A1* | 7/2002 | Haba et al. .................. 205/125 |
| 2002/0084193 A1 | 7/2002 | Merricks et al. |
| 2002/0088713 A1 | 7/2002 | Merricks et al. |
| 2002/0090484 A1 | 7/2002 | Merricks et al. |
| 2002/0112964 A1 | 8/2002 | Gandikota et al. |
| 2002/0127847 A1 | 9/2002 | Alling et al. |
| 2002/0134684 A1 | 9/2002 | Calvert et al. |
| 2002/0153260 A1 | 10/2002 | Egli et al. |
| 2003/0010646 A1 | 1/2003 | Barstad et al. |
| 2003/0015433 A1* | 1/2003 | Tsuchida et al. .............. 205/291 |
| 2003/0094376 A1 | 5/2003 | Seita et al. |
| 2003/0106802 A1 | 6/2003 | Hagiwara et al. |
| 2003/0168343 A1 | 9/2003 | Commander et al. |
| 2003/0205476 A1 | 11/2003 | Calvert et al. |
| 2004/0074775 A1 | 4/2004 | Herdman et al. |
| 2004/0086697 A1 | 5/2004 | Egli et al. |
| 2004/0127009 A1 | 7/2004 | Chen et al. |
| 2004/0138075 A1 | 7/2004 | Brown et al. |
| 2004/0154926 A1 | 8/2004 | Sun et al. |
| 2004/0168928 A1 | 9/2004 | Hardikar |
| 2004/0217009 A1 | 11/2004 | Mikkola et al. |
| 2004/0222104 A1 | 11/2004 | Wang et al. |
| 2004/0249177 A1 | 12/2004 | Wang et al. |
| 2004/0256222 A1 | 12/2004 | Griego et al. |
| 2005/0006245 A1 | 1/2005 | Sun et al. |
| 2005/0014368 A1 | 1/2005 | Yoshioka et al. |
| 2005/0016858 A1 | 1/2005 | Barstad et al. |
| 2005/0020068 A1 | 1/2005 | Wang et al. |
| 2005/0025960 A1 | 2/2005 | Levey et al. |
| 2005/0045485 A1 | 3/2005 | Shih et al. |
| 2005/0045488 A1 | 3/2005 | Paneccasio et al. |
| 2005/0061679 A1 | 3/2005 | Hardikar |
| 2005/0067297 A1 | 3/2005 | Tench et al. |
| 2005/0077180 A1 | 4/2005 | Zierath et al. |
| 2005/0081744 A1 | 4/2005 | Klocke et al. |
| 2005/0133376 A1 | 6/2005 | Opaskar et al. |
| 2005/0176604 A1 | 8/2005 | Lee et al. |
| 2005/0189013 A1 | 9/2005 | Hartley |
| 2005/0189233 A1 | 9/2005 | Shih et al. |
| 2005/0199507 A1 | 9/2005 | Shih et al. |
| 2005/0211564 A1 | 9/2005 | Shih et al. |
| 2005/0230263 A1 | 10/2005 | Dubin |
| 2005/0230354 A1 | 10/2005 | Hardikar |
| 2005/0241946 A1 | 11/2005 | Nagai et al. |
| 2005/0268963 A1 | 12/2005 | Jordan et al. |
| 2005/0274620 A1 | 12/2005 | Kovarsky et al. |
| 2005/0274622 A1 | 12/2005 | Sun et al. |
| 2005/0287818 A1 | 12/2005 | Hata et al. |
| 2006/0003566 A1 | 1/2006 | Emesh |
| 2006/0012044 A1 | 1/2006 | Knop et al. |
| 2006/0024430 A1 | 2/2006 | Yau et al. |
| 2006/0046079 A1 | 3/2006 | Lee et al. |
| 2006/0081475 A1 | 4/2006 | Barstad et al. |
| 2006/0118422 A1 | 6/2006 | Ko et al. |
| 2006/0137732 A1 | 6/2006 | Farahani et al. |
| 2006/0141156 A1 | 6/2006 | Viel et al. |
| 2006/0141784 A1 | 6/2006 | Paneccasio et al. |
| 2006/0183328 A1 | 8/2006 | Barstad et al. |
| 2006/0201820 A1 | 9/2006 | Opaskar et al. |
| 2006/0213780 A1 | 9/2006 | Shih et al. |
| 2006/0225605 A1 | 10/2006 | Kloeckener et al. |
| 2006/0266655 A1 | 11/2006 | Sun et al. |
| 2007/0289875 A1 | 12/2007 | Paneccasio et al. |
| 2008/0009132 A1 | 1/2008 | Morikazu |
| 2008/0009136 A1 | 1/2008 | Lee et al. |
| 2008/0087549 A1 | 4/2008 | Ishizuka et al. |
| 2008/0090333 A1 | 4/2008 | Haba et al. |
| 2008/0110498 A1 | 5/2008 | Zafar et al. |
| 2008/0188370 A1 | 8/2008 | Vormberg et al. |
| 2008/0221004 A1 | 9/2008 | Farkas |
| 2008/0230119 A1 | 9/2008 | Akimoto |
| 2008/0230393 A1 | 9/2008 | Okazaki et al. |
| 2009/0023820 A1 | 1/2009 | Dailey et al. |
| 2009/0101190 A1 | 4/2009 | Salami et al. |
| 2009/0107547 A1 | 4/2009 | Nakashima et al. |
| 2009/0170306 A1 | 7/2009 | Flake |
| 2010/0024874 A1 | 2/2010 | Varaprasad |

FOREIGN PATENT DOCUMENTS

| | | |
|---|---|---|
| EP | 1422320 A1 | 5/2004 |
| EP | 1489201 A2 | 12/2004 |
| GB | 2032462 | 5/1980 |
| JP | 01008716 A | 5/1983 |
| JP | 58081988 A | 5/1983 |
| JP | 11238704 A * | 8/1999 |
| JP | 2002248397 A | 9/2002 |
| KR | 100683598 A | 9/2005 |
| WO | WO 0111932 A1 * | 2/2001 |
| WO | WO-2004016829 A2 | 2/2004 |
| WO | WO 2005014891 A2 * | 2/2005 |
| WO | WO-2006053242 A2 | 5/2006 |
| WO | WO-2007040065 A1 | 4/2007 |
| WO | WO 2008155408 A1 * | 12/2008 |
| WO | WO-2008157612 A1 | 12/2008 |
| WO | WO-2009020792 A2 | 2/2009 |
| WO | WO-2009126955 A2 | 10/2009 |

OTHER PUBLICATIONS

Gonzalez-Lopez, Jaime, et al., "Self-Associative Behavior and Drug-Solubilizing Ability of Poloxamine (Tetronic) Block Copolymers," Langmuir, vol. 24 (19), pp. 10688-10697, American Chemical Society Publications, Sep. 12, 2008.

Guerro-Lemus et al., Optical and Compositional Characterisation of Stain-Etched Porous Silicon Subjected to Anodic Oxidation and Thermal Treatments, Materials Science and Engineering, B1 01, pp. 249-254.

International Search Report and Written Opinion, PCT/US2005/040996, dated May 10, 2006.

Jonsson, Bo, et al. "Surfactants and Polymers in Aqueous Solution," John Wiley & Sons Ltd, 1998.

Moffat, T.P., et al., "Superconformal Film Growth: Mechanism and quantifications," International Business Machines Corporation, vol. 49 No. 1, Jan. 2005.

Schmolka, Irving, et al., "A Review of Block Polymer Surfactants," Journal of the American Oil Chemists's Society, vol. 54, No. 3, 110-116, Mar. 1997.

Shuman V., Effect of Anodic Etching of Heavily Doped Silicon on the Location of the Plasma Minimum, Technical Physics Letters, vol. 25, No. 4, pp. 319-320, Apr. 1999.

Tetronic 1107 Block Copolymer Surfactant, Product Manual, BASF Corporation 2004.

Tetronic 304 Safety data sheet, Product Manual, Revision date: May 23, 2007, Version 2.0, p. 1/5.

Tetronic and Tetronic R Block Copolymer Surfactants, Product Manual, BASF Corporation, 1998-2007.

Vereecken, P.M., et al., "The Chemistry of Additives in Damascence Copper Plating," International Business Machines Corporation, vol. 49 No. 1, Jan. 2005.

* cited by examiner

HIGH SPEED COPPER PLATING BATH

BACKGROUND OF THE INVENTION

The present invention relates to the field of electroplating of metals and more particularly to novel electroplating baths, electroplating aqueous solutions and methods of electroplating copper onto a substrate.

Copper based materials are frequently used as low resistivity interconnects in the microelectronics industry. In addition to its use for IC interconnects, the use of copper electrodeposition to produce high aspect ratio structures such as vias, pillars, and bumps on semiconductor chips is one of the key technologies for 3D packaging. It is important that an electroplating process for copper be sufficiently fast to allow the processing of a large number of substrates and have an acceptable yield. This is particularly important for the production of the high aspect ratio structures that are needed for 3D packaging, since larger amounts of copper need to be plated for this purpose. However, current electroplating processes for copper are not sufficiently fast because the copper plating speed is normally limited by the mass transport of copper ions in the aqueous plating solution in the diffusion layer area. Only high copper ion concentrations are able to accommodate high speed plating under mass transport controlled conditions. However the copper concentration is limited by the solubility of copper salts at ambient temperature to allow the transportation of electrolytic solutions from material suppliers to manufacturers. Therefore, the maximum copper concentration is limited by the copper salt solubility in any selected electrolytic solution at normal transportation temperatures.

SUMMARY OF THE INVENTION

Electroplating baths for the high speed electroplating of copper and methods of electroplating copper on semiconductor chips are disclosed. In particular, copper electroplating baths that includes an aqueous solution that comprises a copper salt and at least one acid and a container that comprises a copper salt in solid form, is disclosed. The container supplies copper ions to the aqueous solution to maintain the copper ion concentration of the aqueous solution at saturation levels while retaining the copper salt in solid form within the container. This makes possible high electroplating speeds that are particularly useful for plating high aspect ratio structures such as vias, pillars, and bumps on semiconductor chips without using more costly and toxic high solubility copper salts.

In one embodiment, the present invention provides copper electroplating baths comprising: an aqueous solution that comprises a copper salt and at least one acid; at least one additive to accelerate the copper deposition rate of the copper electroplating bath; and a container that comprises a copper salt in solid form, wherein the container is immersed in the aqueous solution and supplies copper ions to the aqueous solution to maintain the copper ion concentration of the aqueous solution at about saturation levels while retaining the copper salt in solid form within the container.

In certain embodiments, the container of the copper electroplating bath comprises a sealed box having a plurality of openings that are covered with a porous membrane that allows dissolved copper ions to leave the container while retaining the copper salt in solid form within the container.

In additional embodiments, the present invention provides methods of electroplating copper on substrates comprising: providing a substrate; placing the substrate in contact with a copper electroplating bath, wherein the copper electroplating bath comprises an aqueous solution that comprises a copper salt and at least one acid and a container that comprises a copper salt in solid form, wherein the container is immersed in the aqueous solution and supplies copper ions to the aqueous solution to maintains the copper ion concentration of the aqueous solution at about saturation levels while retaining the copper salt in solid form within the container; and electroplating copper on the substrate.

BRIEF DESCRIPTION OF THE DRAWINGS

Preferred and alternative embodiments of the present invention are described in detail below with reference to the following drawings.

DETAILED DESCRIPTION OF EXEMPLARY EMBODIMENTS OF THE INVENTION

Figure 1A:
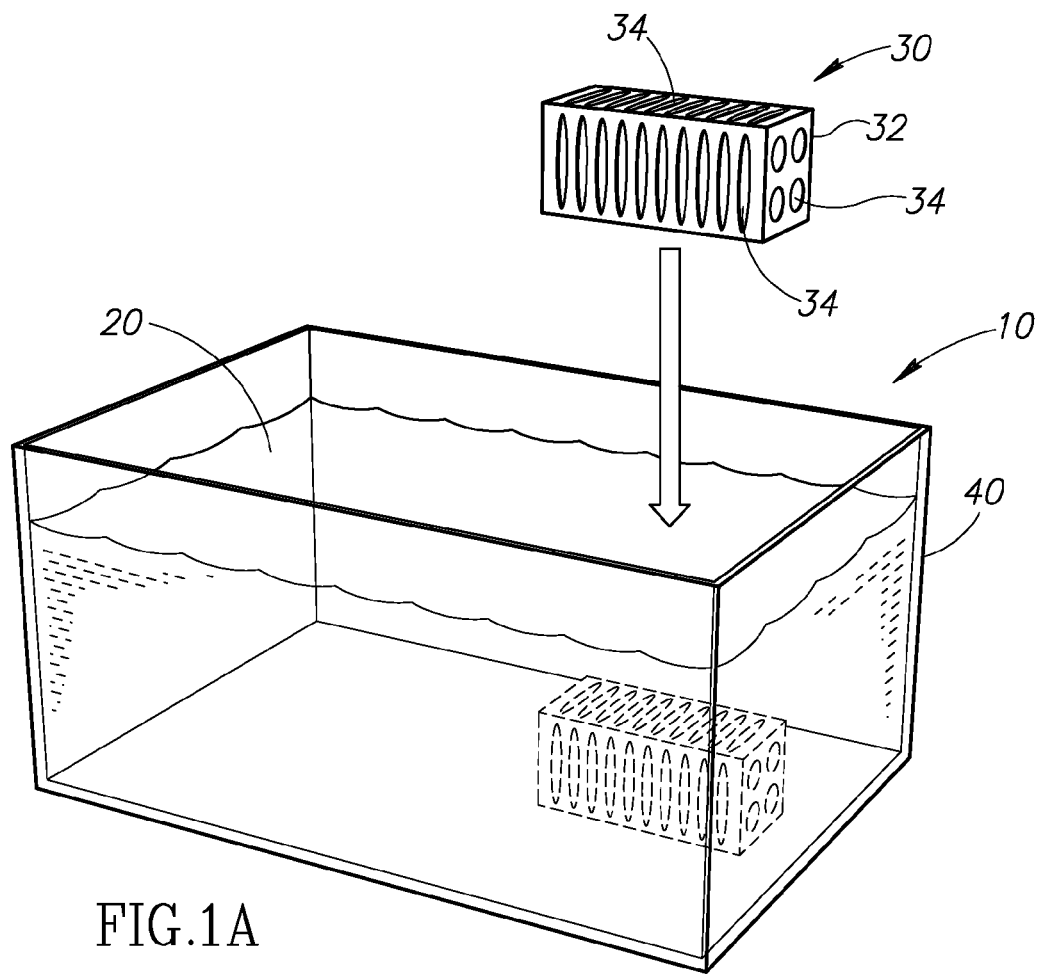
FIG. 1A is a schematic view of an exemplary copper electroplating bath, in accordance with an embodiment of the present invention.
Figure 1B:
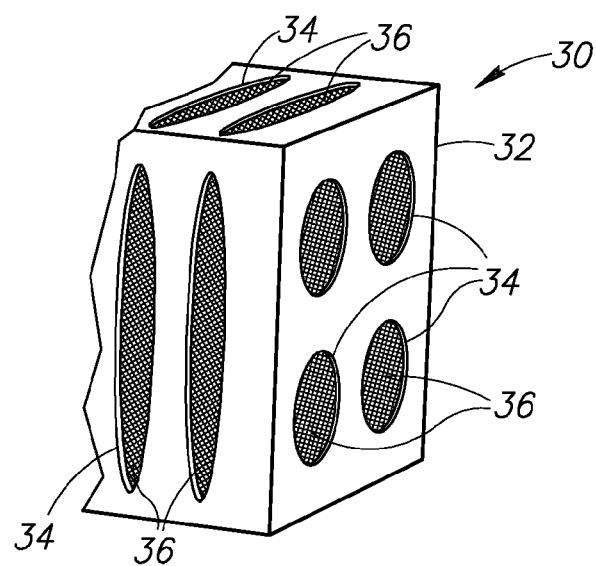
FIG. 1B is a schematic, magnified view of a portion of a container used in an exemplary copper electroplating bath, in accordance with an embodiment of the present invention.

Referring now to FIG. 1, a schematic view of an exemplary copper electroplating bath 10, in accordance with an embodiment of the present invention, is shown. The copper electroplating bath 10 includes an aqueous solution 20 that comprises a copper salt and at least one acid and a container 30 that comprises a copper salt in solid form. Optionally, the copper electroplating bath 10 can include various other materials, including chloride ions and one or more additives to accelerate the copper deposition rate of the copper electroplating bath 10. The container 30 is immersed in the aqueous solution 20 and supplies copper ions to the aqueous solution 20 to maintain the copper ion concentration of the aqueous solution 20 at about saturation levels while retaining the copper salt in solid form within the container 30. The term "copper ions" as used herein includes both the $Cu^{2+}$ and the $Cu^+$ species. In the illustrated embodiment, the container 30 is a sealed box 32 having a plurality of openings 34 that are covered with a porous membrane 36 (FIG. 1B) that allows dissolved copper ions to leave the container 30 while retaining the copper salt in solid form within the container 30. However, it should be understood that the container 30 can be any structure that supplies copper ions to the aqueous solution 20 to maintain the copper ion concentration of the aqueous solution 20 at about saturation levels while retaining the copper salt in solid form within the container 30. Also shown in FIG. 1 is a tank 40 for holding the copper electroplating bath 10.

Various copper salts can be used in the copper electroplating bath 10 of the present invention. Suitable copper salts for use in the aqueous solution 20 and in solid form in the container 30 include, for example, copper sulfate, copper pyrophosphate, copper sulfamate, copper chloride, copper formate, copper fluoride, copper nitrate, copper oxide, copper tetrafluoroborate, copper trifluoromethanesulfonate, copper trifluoroacetate and copper methane sulfonate, or hydrates of any of the foregoing compounds. In one embodiment, the copper salt used in the aqueous solution 20 and in solid form in the container 30 is copper sulfate. The concentration of the copper salt used in the aqueous solution 20 will vary depending on the particular copper salt used and can range from about 10 grams/liter to about 400 grams/liter. In the case of copper sulfate, the concentration used in the aqueous solution 20 can range from about 50 grams/liter to about 250 grams/liter. The amount of the copper salt used in solid form in the container 30 will vary depending on the particular copper salt used and can range from about 10 grams to about 1000 grams per liter of the aqueous solution 20. In the case of copper sulfate, the amount used in the container 30 can range from about 100 grams to about 600 grams per liter of the aqueous solution 20.

Various acids can be used in the copper electroplating bath 10 of the present invention. Suitable acids include, for example, sulfuric acid, methanesulfonic acid, fluoroboric acid, hydrochloric acid, hydroiodic acid, hydroboric acid, nitric acid, phosphoric acid and other suitable acids. In one embodiment, the acid used in the copper electroplating bath 10 is sulfuric acid. The concentration of the acid used in the copper electroplating bath 10 will vary depending on the particular acid used and can range from about 10 grams/liter to about 300 grams/liter. In the case of sulfuric acid, the concentration used in the copper electroplating bath 10 can range from about 20 grams/liter to about 200 grams/liter.

Optionally, chloride ions can be included in the copper electroplating bath 10 of the present invention. Suitable sources of chloride ions include, for example, hydrochloric acid, sodium chloride, potassium chloride and any bath soluble chloride salts. The concentration of chloride ions used in the copper electroplating bath 10 can range from about 10 ppm to about 100 ppm.

If desired, one or more optional additives that accelerate the copper deposition rate can be used in the copper electroplating bath 10 of the present invention. Suitable additives include, for example, brighteners, for example, organic sulfide compound, such as bis(sodium-sulfopropyl)disulfide, 3-mercapto-1-propanesulfonic acid sodium salt, N,N-dimethyl-dithiocarbamyl propylsulfonic acid sodium salt and 3-S-isothiuronium propyl sulfonate, or mixtures of any of the foregoing compounds. Additional suitable accelerator agents include, but are not limited to, thiourea, allylthiourea, acetylthiourea, pyridine, mixtures of any of the foregoing compounds, or other suitable accelerator agents.

The electroplating solution may also include additives, such as a carriers, leveler agents, or both that improve certain electroplating characteristics of the electroplating solution. Carriers may be a surfactant, a suppressor or a wetting agent. Levelers may be a chelating agent, a dye, or an additive that exhibits a combination of any of the foregoing functionalities. The carrier and leveler agents may be selected from the following agents: a polyether surfactant, a non-ionic surfactant, a cationic surfactant, an anionic surfactant, a block copolymer surfactant, a polyethylene glycol surfactant, polyacrylic acid, a polyamine, aminocarboxylic acid, hydrocarboxylic acid, citric acid, entprol, edetic acid, tartaric acid, a quaternized polyamine, a polyacrylamide, a cross-linked polyamide, a phenazine azo-dye (e.g., Janus Green B), an alkoxylated amine surfactant, polymer pyridine derivatives, polyethyleneimine, polyethyleneimine ethanol, a polymer of imidazoline and epichlorohydrine, benzylated polyamine polymer, mixtures of any of the preceding suppressor agents, or other suitable suppressor agents. In a more specific embodiment of the invention, a combination of one accelerator, one carrier and one leveler is added to the electroplating bath to improve certain electroplating characteristics.

Various materials can be used to construct the container 30, used in the copper electroplating bath 10 of the present invention. For example, in the embodiment illustrated in FIG. 1 in which the container 30 is a sealed box 32 having a plurality of openings 34 that are covered with a porous membrane 36, the sealed box 32 can be constructed from a plastic such as high density polyethylene, and the porous membrane 36 can be a fiber or filter membrane. 36 made from a material such as PFA, PTFE, PVDF or similar materials. Other suitable materials for construction of the sealed box 32 include, for example, a fabric bag, while other suitable materials for the porous membrane 36 include, for example, PFA or PTFE. In general, the number of openings 34 must be high enough and the pores of the porous membrane 36 must be large enough to allow the aqueous solution 20 containing copper ions to pass through the porous membrane 36 while retaining the copper salt in solid form within the container 30. In one embodiment, the plurality of openings 34 constitute about 50% to about 90% of the surface area of the sealed box 32 and the pore size of the porous membrane 36 ranges from about 1 micron to about 10 microns. While the sealed box 32 in the embodiment illustrated in FIG. 1 has a rectangular shape, it should be understand that the sealed box can have any desired shape without departing from the scope of the present invention.

Also contemplated hereunder are methods for electroplating copper on a substrate using the copper electroplating bath of the present invention that is described in detail above. In describing this method, reference will be made to FIG. 2, which shows a block diagram illustrating an exemplary method of electroplating copper on a substrate using the copper electroplating bath of the present invention.

Figure 2:
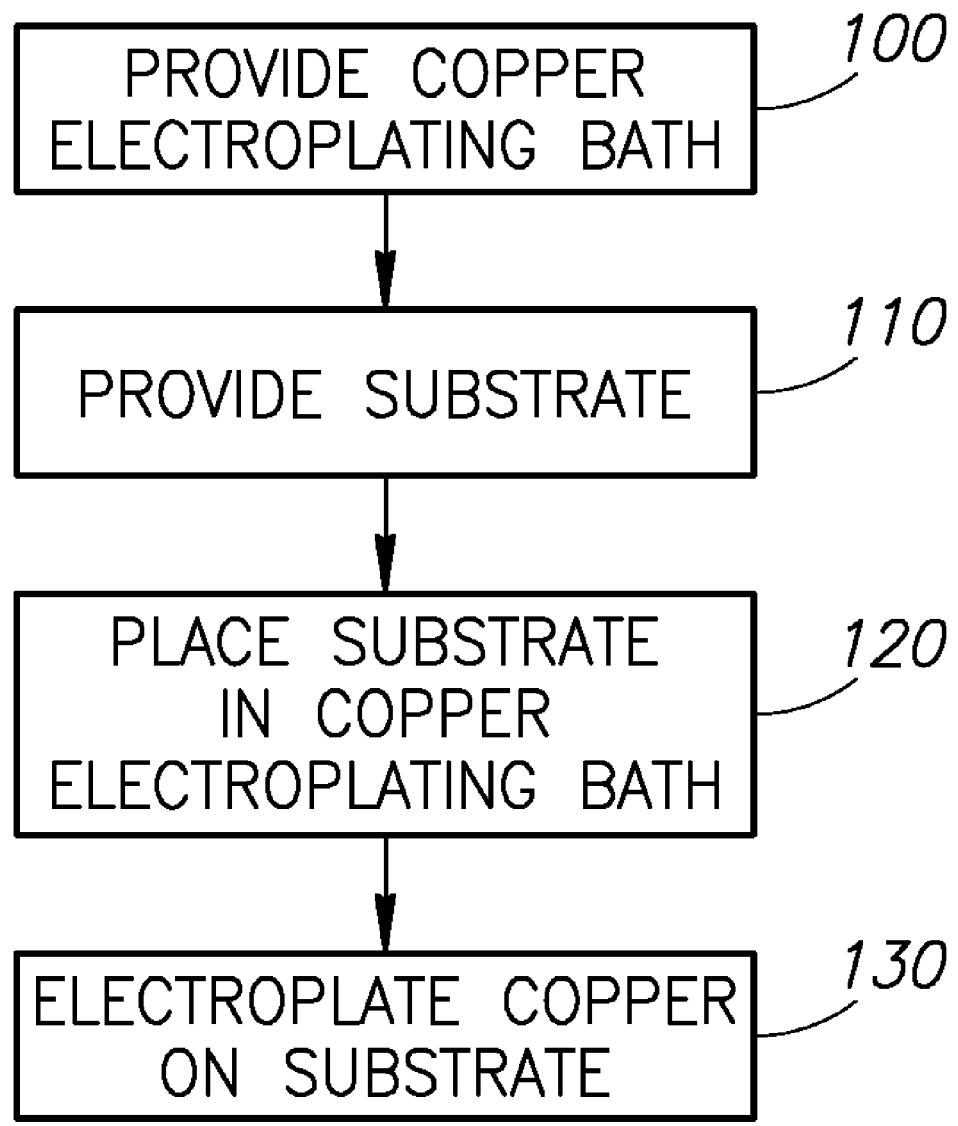
FIG. 2, is a block diagram illustrating an exemplary method of electroplating copper on a substrate, in accordance with an embodiment of the present invention.

Block 100 of FIG. 2 represents provision of the copper electroplating of the present invention that is described in detail above. The pH and temperature of the copper electroplating bath are selected and maintained to promote efficient plating of copper on a substrate. With respect to pH, in one embodiment, the pH of the copper electroplating bath is below 7. If necessary, the pH of the copper electroplating bath may be adjusted with an acid such as sulfuric acid or a base such as sodium hydroxide. With respect to temperature, in one embodiment, the temperature of the copper electroplating bath ranges from about 24° C. to about 60° C. In another embodiment, the temperature of the copper electroplating bath is about 45° C.

Block 110 of FIG. 2 represents providing a substrate to be electroplated. Various substrates can be electroplated with copper in accordance with the present invention. In general, the term "substrate" as used herein means any material on which copper is to be electroplated. Typically, the substrate is a semiconductor material such as a silicon wafer. Other suitable substrates include, for example, circuit boards with large and small diameters, high aspect ratio microvias, through silicon-vias, or circuit boards with large and small diameters, high aspect ratio pillars, bumps and other apertures.

Blocks 120 and 130 of FIG. 2 represent placing the substrate in contact with the copper electroplating bath and electroplating copper on the substrate, respectively. In order for the electroplating of copper to take place, an electric current is applied to the copper electroplating bath using a set of electrodes (i.e., an anode and a cathode). For the electroplating of copper, the anode is typically made of copper plates or phosphorus doped copper plates and the cathode is typically the substrate. The amount of current applied to the copper electroplating bath can vary widely, with typical current densities ranging from about 10 mA/cm$^2$ to about 600 mA/cm$^2$. The substrate is removed from the electroplating path after the desired amount of copper is electroplated on the substrate. In one embodiment, the substrate remains in the copper electroplating bath for a time period ranging from about 1 min to about 90 min. In other embodiments, the substrate remains in the copper electroplating bath for a time period ranging from about 5 minute to about 25 minutes.

The copper electroplating baths of the present invention and related methods make possible high copper electroplating speeds. In one embodiment, the electroplating speed is about 6 microns per minute or greater. These high electroplating speeds are particular useful for electroplating high aspect ratio structures (i.e., structures having a height:diameter ratio greater than 1:1) on substrates. Such high aspect ratio structures include, for example copper pillars, copper bumps, copper through-silicon vias, copper micro vias and trenches and the like.

The following examples illustrate certain embodiments of the present invention, and are not to be construed as limiting the present disclosure.

EXAMPLES

Example 1

Figure 3:
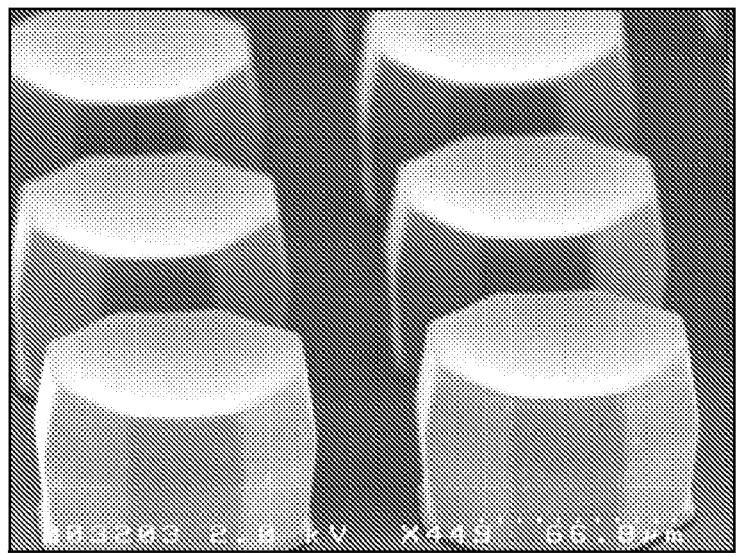
FIG. 3 is a scanning electron microscope image of copper pillars having a thickness of 70 microns that have been plated on a semiconductor wafer, wherein the sample I.D. (003203), the electron beam energy (2.0 kV), the image magnification (×449) and a dashed line corresponding to a distance of 66.8 microns are shown, in accordance with an embodiment of the present invention.

A plating bath containing 240 g/L copper sulfate, 60 g/L sulfuric acid, 50 ppm chloride and a basket containing solid copper sulfate (180 g per liter of plating bath) was used to plate test wafers with copper pillars having a thickness of 70 um, and aspect ratios of 0.78:1 (height:diameter). Additives included 40 ppm of the accelerator bis(sodium-sulfopropyl) disulfide, 100 ppm of the carrier polyethylene glycol:polypropylene glycol monobutyl ether block copolymer (molecular weight=750) and 100 ppm of the leveler RALU®PLATE CL 1000 (Raschig GmbH, Ludwigshafen, Germany). Plating speeds of 6 um/min, and 7 um/min were obtained at a plating bath temperature of 45° C. FIG. 3 is a SEM image of plating results that were obtained using a 6 um/min plating speed (plating time was 11 minutes).

Example 2

Figure 4:
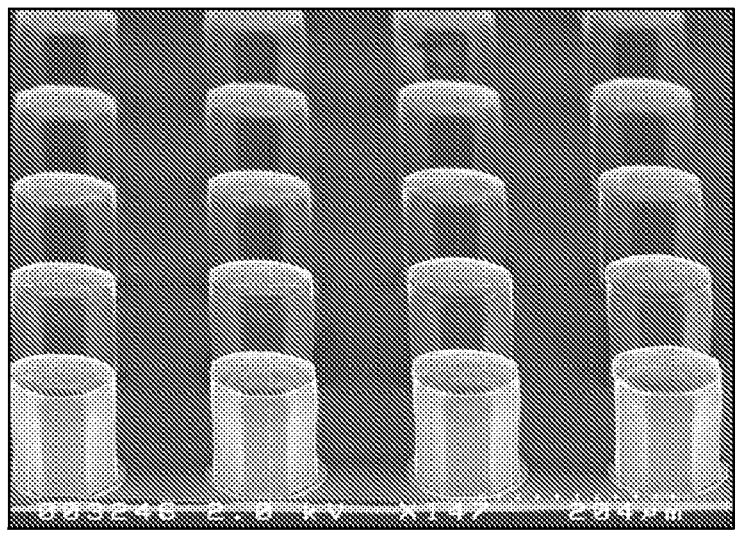
FIG. 4 is a scanning electron microscope image of copper pillars having a thickness of 120 microns that have been plated on a semiconductor wafer, wherein the sample I.D. (003246), the electron beam energy (2.0 kV), the image magnification (×147) and a dashed line corresponding to a distance of 204 microns are shown, in accordance with an embodiment of the present invention.

The same plating electrolyte bath conditions as used in Example 1 but with different additives were used to plate test wafers with copper pillars having a thickness of 120 um and aspect ratios of 1.2:1 (height:diameter). Additives included 40 ppm of the accelerator bis(sodium-sulfopropyl)disulfide, 100 ppm of the carrier polyethylene glycol and 100 ppm of the leveler Ralu®Mer 11 (Raschig GmbH, Ludwigshafen, Germany). FIG. 4 is a SEM image of plating results that were obtained using a plating bath temperature of 45° C. and a 6 um/min plating speed (plating time was 20 minutes).

It is to be understood that this invention is not limited to the particular methods, apparatus and materials disclosed herein as such methods, apparatus and materials may vary somewhat. It is also to be understood that the terminology employed herein is used for the purpose of describing particular embodiments only and is not intended to be limiting since the scope of the present invention will be limited only by the appended claims and equivalents thereof.

The embodiments of the invention in which an exclusive property or privilege is claimed are defined as follows:

1. A method of changing a copper concentration in an electroplating bath, comprising:
   placing a substrate in a copper electroplating bath comprising an acidic, aqueous solution exhibiting a copper ion concentration;
   disposing a copper salt in solid form within a container located in the copper electroplating bath, a chamber of the container being in fluid communication with an the aqueous solution of the copper electroplating bath;
   dissolving at least some of the copper salt in solid form to raise the copper ion concentration in the aqueous solution and maintain the copper ion concentration in the aqueous solution at about saturation to achieve high copper ion concentrations for accommodating high speed plating; and
   electroplating copper on the substrate using a copper containing anode.

2. The method of claim 1, wherein the aqueous solution comprises at least one of copper sulfate, copper methane sulfonate, copper fluoroborate, copper acetate, copper nitrate, copper oxide, copper hydroxide and copper chloride.

3. The method of claim 1, wherein a concentration of the copper salt in the aqueous solution ranges from about 10 grams/liter to about 400 gram/liter.

4. The method of claim 1, wherein the aqueous solution comprises at least one of sulfuric acid, methanesulfonic acid, fluoroboric acid, hydroboric acid, hydrochloric acid, hydroiodic acid, phosphoric acid and boric acid.

5. The method of claim 1, wherein a concentration of acid in the aqueous solution ranges from about 10 grams/liter to about 250 grams/liter.

6. The method of claim 1, wherein the aqueous solution comprises at least one additive to accelerate the copper deposition rate of the copper electroplating bath.

7. The method of claim 1, wherein the aqueous solution comprises at least one suppressor additive.

8. The method of claim 1, wherein the copper salt in solid form is selected from the group consisting of copper sulfate, copper methane sulfonate, copper fluoroborate, copper acetate, copper nitrate, copper oxide, copper hydroxide and copper chloride.

9. The method of claim 1, wherein the container comprises a membrane that allows dissolved copper salt to leave the container while retaining the copper salt in solid form within the container.

10. The method of claim 9, wherein an area of the membrane comprises about 50% to about 90% of a surface area of the container.

11. The method of claim 1, wherein the container comprises an enclosure containing a porous membrane material having pore sizes ranging from about 1 μm to about 100 μm.

12. The method of claim 1, wherein the copper salt comprises copper sulfate.

13. The method of claim 12, wherein a copper sulfate concentration of the aqueous solution ranges from about 50 grams/liter to about 250 grams/liter.

14. The method of claim 12, wherein a concentration of copper sulfate in the aqueous solution ranges from about 100 grams to about 300 grams per liter.

15. The method of claim 1, wherein the aqueous solution comprises sulfuric acid.

16. The method of claim 15, wherein a sulfuric acid concentration of the aqueous solution ranges from about 20 grams/liter to about 100 grams/liter.

17. The method of claim 1, wherein the aqueous solution comprises chloride ions.

18. The method of claim 17, wherein a chloride ion concentration of the aqueous solution ranges from about 10 ppm to about 100 ppm.

19. The method of claim 1, wherein a temperature of the aqueous solution ranges from about 30° C. to about 60° C.

20. The method of claim 1, wherein electroplating copper comprises an electroplating speed of about 4 microns per minute or greater.

21. The method of claim 1, wherein electroplating copper comprises electroplating one or more high aspect ratio copper structures on the substrate.

22. The method of claim 21, wherein the high aspect ratio structures are selected from the group consisting of pillars, bumps and through-silicon vias.

23. The method of claim 1, further comprising:
retaining at least a portion of the copper salt in solid form within the container.

24. The method of claim 1, wherein the container is immersed in the aqueous solution.

25. The method of claim 1, wherein said step of placing the substrate in the copper electroplating bath is performed after said step of dissolving at least some of the copper salt.

* * * * *